United States Patent
Honda et al.

(10) Patent No.: US 7,605,076 B2
(45) Date of Patent: Oct. 20, 2009

(54) METHOD OF MANUFACTURING A SEMICONDUCTOR DEVICE FROM WHICH DAMAGE LAYERS AND NATIVE OXIDE FILMS IN CONNECTION HOLES HAVE BEEN REMOVED

(75) Inventors: Makoto Honda, Yokohama (JP); Kaori Yomogihara, Yokohama (JP); Kazuhiro Murakami, Oita (JP); Masanori Numano, Yokohama (JP); Takahito Nagamatsu, Oita (JP); Hideaki Harakawa, Kawasaki (JP); Hideto Matsuyama, Yokohama (JP); Hirokazu Ezawa, Tokyo (JP); Hisashi Kaneko, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 458 days.

(21) Appl. No.: 11/346,236

(22) Filed: Feb. 3, 2006

(65) Prior Publication Data

US 2006/0189145 A1 Aug. 24, 2006

(30) Foreign Application Priority Data

Feb. 4, 2005 (JP) .............................. 2005-029454

(51) Int. Cl.
*H01L 21/4763* (2006.01)
*H01L 21/28* (2006.01)
*H01L 21/302* (2006.01)

(52) U.S. Cl. .................... 438/637; 438/581; 438/706; 438/745

(58) Field of Classification Search ................. 438/637, 438/639, 706, 710, 581, 745; 257/E21.252
See application file for complete search history.

(56) References Cited

U.S. PATENT DOCUMENTS

| 6,235,640 B1 | 5/2001 | Ebel et al. |
| 6,329,268 B1 * | 12/2001 | Nakamori et al. ........... 438/482 |
| 6,638,855 B1 | 10/2003 | Chang et al. |

FOREIGN PATENT DOCUMENTS

| CN | 1107338 | 4/2003 |
| CN | 1512546 | 7/2004 |
| JP | 06-283460 | 10/1994 |
| JP | 2000-236021 | 8/2000 |

OTHER PUBLICATIONS

The Notification of the Office Action in the First Examination mailed Aug. 17, 2007, in counterpart Chinese Application No. 200610003051.5.

* cited by examiner

*Primary Examiner*—Hung Vu
(74) *Attorney, Agent, or Firm*—Finnegan, Henderson, Farabow, Garrett & Dunner, L.L.P.

(57) ABSTRACT

An insulating film formed on a conducting layer is dry-etched so as to make a connection hole in the insulating film to expose the conducting layer. Plasma is supplied onto the exposed conducting layer to dry-clean a damage layer produced in the connection hole. A product produced in the connection hole as a result of the dry cleaning is removed by a wet process. An oxide film formed in the connection hole as a result of the wet process is etched by a chemical dry process using a gas including either $NF_3$ or HF. A thermally decomposable reaction product produced as a result of the etching is removed by heat treatment.

10 Claims, 5 Drawing Sheets

| Process | Atomic % | | | | | |
|---|---|---|---|---|---|---|
| | C | N | O | F | Si | Ni |
| (1) | 27 | 1 | 22 | 26 | 8 | 16 |
| (2) | 7 | - | 53 | - | 20 | 20 |
| (3) | 9 | - | 59 | - | 13 | 19 |
| (4) | 3 | <1 | 55 | - | 25 | 17 |
| (5) | 5 | 1 | 38 | 2 | 26 | 28 |

FIG. 2

| Sample | Area value (counts/s) | | Si oxide film thickness (XPS) | |
|---|---|---|---|---|
| | Si-O | Si-Ni | Si-O/SiNi area ratio | Film thickness (nm) |
| (1) | 2124 | 1212 | 1.8 | 3.3 |
| (2) | 6285 | 2358 | 2.7 | 4.0 |
| (3) | 5442 | 424 | 12.8 | 7.0 |
| (4) | 8721 | 2853 | 3.1 | 4.3 |
| (5) | 5216 | 4297 | 1.2 | 2.8 |

FIG. 3

Before a wet process
F I G. 4A
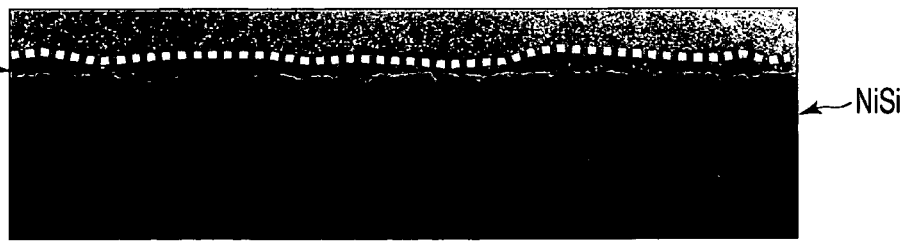
After a wet process
F I G. 4B

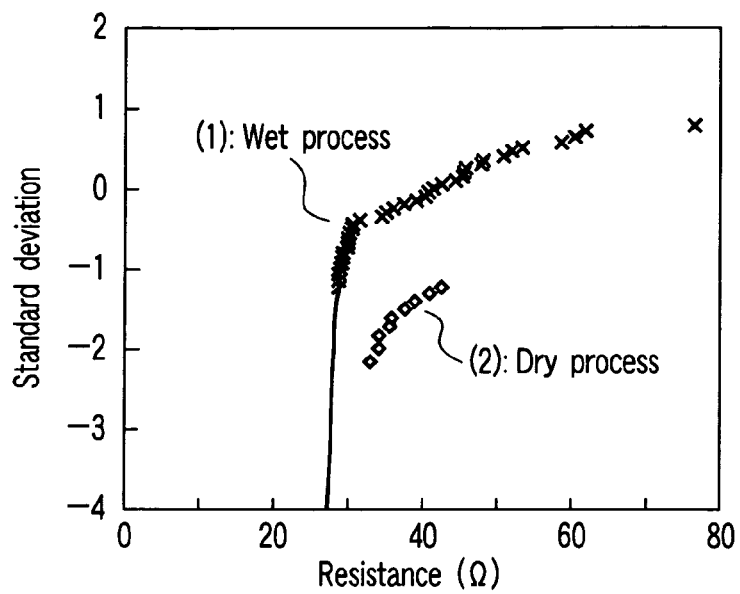
F I G. 5
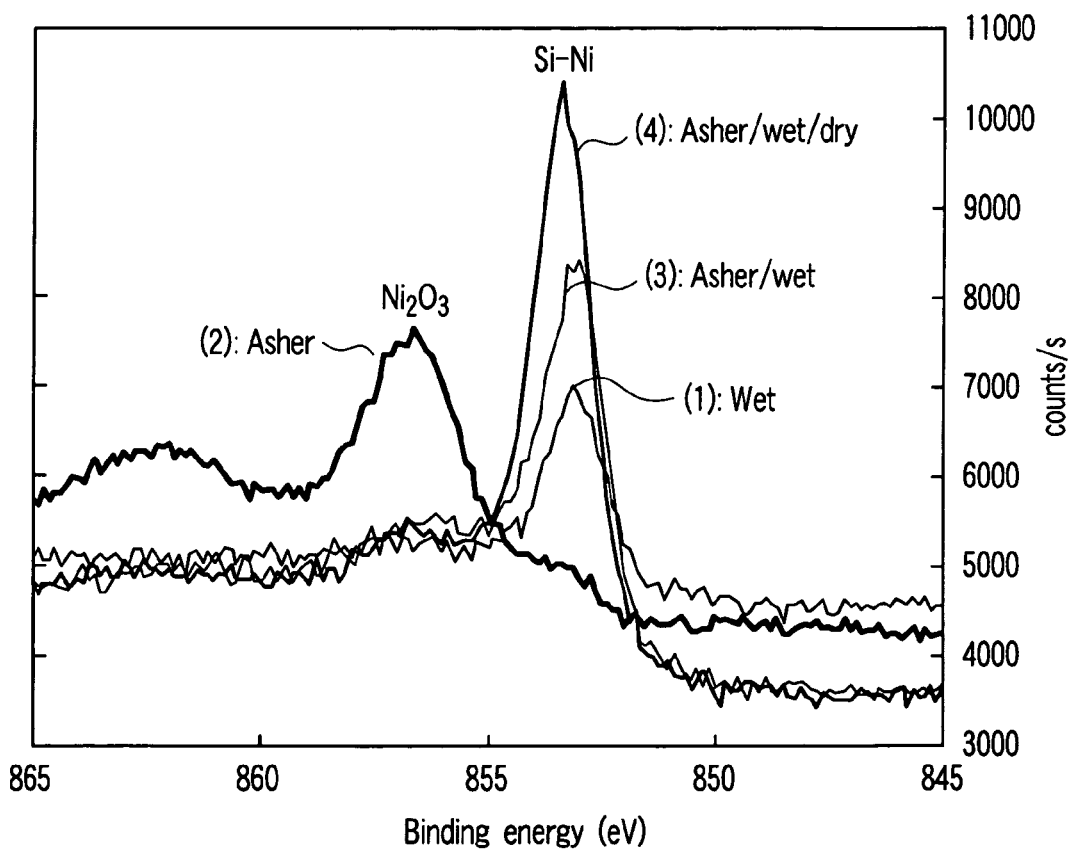
F I G. 6

METHOD OF MANUFACTURING A SEMICONDUCTOR DEVICE FROM WHICH DAMAGE LAYERS AND NATIVE OXIDE FILMS IN CONNECTION HOLES HAVE BEEN REMOVED

CROSS-REFERENCE TO RELATED APPLICATIONS

This application is based upon and claims the benefit of priority from prior Japanese Patent Application No. 2005-029454, filed Feb. 4, 2005, the entire contents of which are incorporated herein by reference.

BACKGROUND OF THE INVENTION

1. Field of the Invention

This invention relates to a semiconductor device manufacturing method, and more particularly to a method of making connection holes, such as contact holes.

2. Description of the Related Art

In a semiconductor device, plugs made of conducting material have been used. Each of the plugs electrically connects a transistor to a wiring layer above the transistor or a lower wiring layer to an upper wiring layer. To do this, a connection hole, such as a contact hole or a via hole, is made in the insulating film covering the transistor or in the insulating film between the lower wiring layer and upper wiring layer and then is filled with conducting material, thereby forming a plug.

For instance, when a contact hole is made, an insulating film is etched using, for example, RIE (Reactive Ion Etching) techniques. In this etching, a damage layer is formed on the sidewall and at the bottom of the contact hole. The damage layer is removed by, for example, a wet process. However, the surface of the conducting layer, such as a metal silicide layer, exposed at the bottom of the contact hole after the damage layer has been removed is non-uniform. Moreover, during the removal of the damage layer, another damage layer and a native oxide film are formed. When a barrier metal is formed in the contact hole with the damage layer and native oxide film being left as described above, the contact resistance increases and the characteristic of the transistor deteriorates. Therefore, it is necessary to remove the damage layer and native oxide film completely.

To remove a damage layer formed in a contact hole, techniques using only dry cleaning have been developed (refer to, for example, Jpn. Pat. Appln. KOKAI Publication No. 2000-236021).

In the conventional cleaning method, however, it was difficult to sufficiently remove the damage layer and native oxide film in the contact hole. Therefore, a semiconductor device manufacturing method capable of sufficiently removing the damage layer and native oxide film in the contact hole has been desired. Furthermore, when a contact hole is made in a plurality of insulating films stacked one on top of another, steps might develop in the contact hole. Therefore, the development of the technique for removing the steps has been desired.

BRIEF SUMMARY OF THE INVENTION

According to a first aspect of the invention, there is provided a semiconductor device manufacturing method comprising: dry-etching an insulating film formed on a conducting layer so as to make a connection hole in the insulating film to expose the conducting layer; supplying plasma excited from an oxidized gas onto the exposed conducting layer to dry-clean a damage layer produced in the connection hole; removing a product produced in the connection hole as a result of the dry cleaning by a wet process; etching an oxide film formed in the connection hole as a result of the wet process by a chemical dry process using a gas including either $NF_3$ or HF; and removing a thermally decomposable reaction product as a result of the etching by heat treatment.

According to a second aspect of the invention, there is provided a semiconductor device manufacturing method comprising: dry-etching a silicon nitride film and a silicon oxide film stacked on a conducting layer so as to make a connection hole in the silicon nitride film and silicon oxide film to expose the conducting layer; etching steps in the silicon nitride film and silicon oxide film formed in the connection hole by chemical dry process using a gas including either $HF_3$ or HF; and removing a thermally decomposable reaction product as a result of the etching by heat treatment.

BRIEF DESCRIPTION OF THE SEVERAL VIEWS OF THE DRAWING

FIG. 2 shows the result of analyzing a semiconductor device processed by the method of the first embodiment and a conventional manufacturing method by use of X-ray photoelectron spectroscopy;

FIG. 3 shows the result of analyzing a semiconductor device processed by the method of the first embodiment and the conventional manufacturing method by use of X-ray photoelectron spectroscopy;

FIGS. 4A and 4B relate to the first embodiment, showing transmission electron microscope (TEM) photographs illustrating the states of the semiconductor device before and after a wet process;

FIG. 5 shows variations in the contact resistance caused by a dry process and a wet process;

FIG. 6 shows the result of analyzing a semiconductor device processed by the method of the first embodiment by use of X-ray photoelectron spectroscopy;

DETAILED DESCRIPTION OF THE INVENTION

Hereinafter, referring to the accompanying drawings, embodiments of the present invention will be explained.

First Embodiment

FIGS. 1A to 1E are sectional views to explain a semiconductor device manufacturing method according to a first embodiment of the present invention. The first embodiment shows an example of forming a metal contact with, for example, a silicide layer.

Figure 1A:
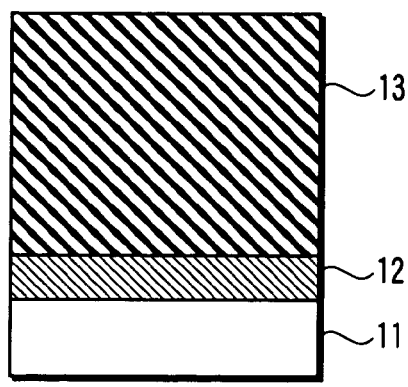
FIGS. 1A to 1E are sectional views to explain a semiconductor device manufacturing method according to a first embodiment of the present invention.

As shown in FIG. 1A, a silicide layer 12 acting as a conducting layer is formed at the surface of, for example, a silicon substrate 11. The silicide layer 12 is any one of, for example, $CoSi_x$, $NiSi_x$, $ErSi_x$, $PtSi_x$, and $Pd_2Si_x$. However, the silicide layer 12 is not limited to these. In this embodiment, the silicide layer 12 is made of NiSi. Thus, hereinafter, the silicide layer 12 is referred to as the NiSi layer 12. On the NiSi layer 12, an insulating layer, such as a silicon oxide film 13, is formed. The insulating film is not limited to a silicon oxide film. Another material may be used as the insulating film.

Figure 1D:
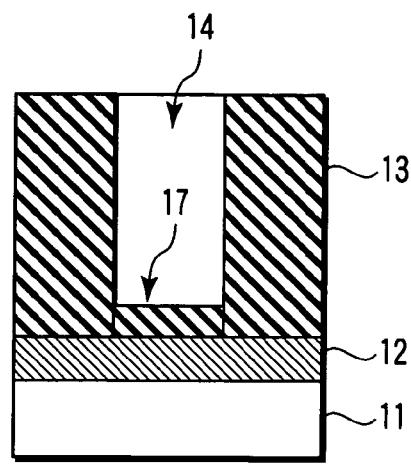
Figure 1B:
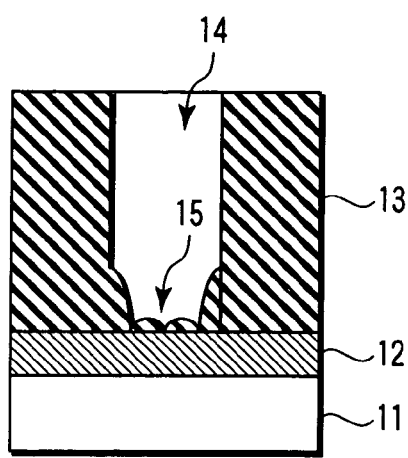

Next, as shown in FIG. 1B, the silicon oxide film 13 is etched by RIE techniques, with, for example, a resist pattern (not shown) as a mask, thereby making a connection hole, such as a contact hole 14. For example, $H_2$-added $CF_4$ gas is used as the etching gas. At the bottom of the contact hole 14 formed as described above, a damage layer 15 is formed. The damage layer 15, which includes damage and etching products produced as a result of the etching, is made chiefly of, for example, F, C, and Si—O as shown in (1) of FIG. 2. FIG. 2 lists the proportions of elements observed in analyzing a semiconductor device processed by the method of the first embodiment and a conventional manufacturing method by use of XPS (X-ray photoelectron spectroscopy).

As described above, after the etching, the damage layer 15 exists at the bottom of the contact hole 14. The result of analysis by XPS has shown that the NiSi combined peak exposed at the bottom of the contact hole 14 is small as shown in (1) of FIG. 3.

In the prior art, after a contact hole was made, cleaning was done in a wet process. The wet process was carried out to remove F and C produced in making the contact hole and the oxide film formed at the bottom of the contact hole. The results of analysis made by XPS after the wet process are shown in (2) of FIG. 2 and (2) of FIG. 3. By such a wet process, F and C are removed as shown in (2) of FIG. 2. However, as shown in FIG. 4B, an oxide film of about 5 nm in thickness is newly formed at the surface of NiSi at the bottom of the contact hole. Therefore, it is difficult to sufficiently clean the surface of the NiSi layer only by the wet process. As shown by (1) of FIG. 6, the result of analysis by XPS has shown that the peak of Ni—Si is small due to the oxide film formed on the surface of the NiSi layer. Furthermore, as shown by (1) of FIG. 5, the formed oxide film has contributed to an increase in the contact resistance in the wet process.

To overcome this problem, it is conceivable that instead of the wet process, a dry process using $NF_3$ gas is carried out as disclosed in Jpn. Pat. Appln. KOKAI Publication No. 2000-236021. In the dry process, an oxide film is not formed on the NiSi layer after F and C are removed. However, the dry process lacks the capability of removing the etching damage layer caused in making a contact hole. Therefore, as shown in (2) of FIG. 5, simply replacing the wet process with the dry process results in an increase in the contact resistance as compared with the wet process shown in (1) of FIG. 5.

In the first embodiment, to overcome this drawback, for example, after the resist pattern is removed, an ashing process is carried out for dry cleaning to remove the etching damage layer 15 formed in making the contact hole. In the ashing process, plasma excited from oxidized gas, such as oxygen gas ($O_2$) or ozone ($O_3$), is used. Moreover, it is desirable that the temperature of the substrate 11 in the ashing process should be in the range from, for example, 150° C. or higher to 400° C. or lower. If the temperature is lower than 150° C., it is difficult to remove the damage layer 15 sufficiently. In addition, when the NiSi layer 12 is formed into, for example, the source and drain region or the gate electrode of a transistor, it is difficult to process the transistor at a temperature higher than 400° C. without the deterioration of the characteristic of the transistor. To obtain a better result, it is desirable that the temperature of the substrate 11 should be in the range from 250° C. or higher to 300° C. or lower. As described above, subjecting the damage layer 15 to the ashing process makes it possible to remove F and C constituting the damage layer 15 almost completely as shown in (3) of FIG. 2.

Figure 1E:
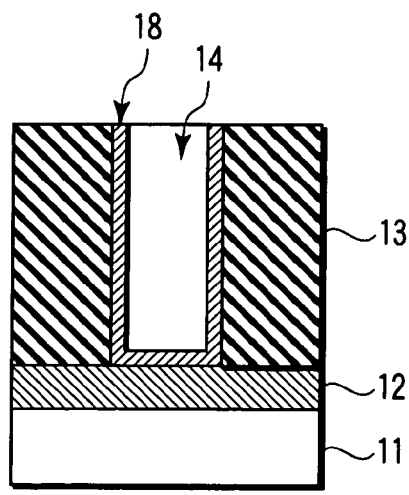
Figure 1C:
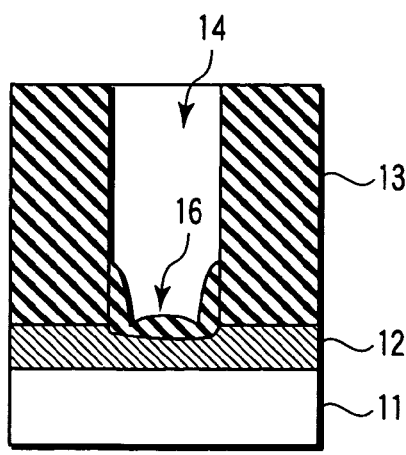

However, when the ashing process is carried out, an ashing product 16 is formed at the surface of the NiSi layer 12 as shown in FIG. 1C. The product 16 includes, for example, Si—O and Ni—O (F) as shown by (2) of FIG. 6 and in (3) of FIG. 3. Moreover, the peak value of $Ni_2O_3$ produced in the ashing process shown by (2) of FIG. 6 is so large that Ni—O (F) is difficult to remove by a dry process.

In the first embodiment, to overcome this problem, the product 16 produced in the ashing process (hereinafter, referred to as the Ni—O (F) layer 16) is removed by a wet process. In the wet process, the product is treated with, for example, sulfuric acid-hydrogen peroxide mixture made of sulfuric acid and hydrogen peroxide solution. Thereafter, the treated product is further treated with hydrogen peroxide solution and choline solution. As described above, carrying out the wet process after the ashing process enables the Ni—O (F) layer 16 to be removed.

Each of (3) of FIG. 6, (4) of FIG. 2, and (4) of FIG. 3 shows a case where a wet process is carried out after an ashing process. As seen from (3) of FIG. 6, the peak value of NiSi appearing at the bottom of the contact hole 14 is larger than when only a wet process is carried out as shown by (1) of FIG. 6. That is, it is seen that the damage layer 15 and Ni—O (F) layer 16 have been removed sufficiently by the ashing process and wet process.

However, when the wet process is carried out, a native oxide film 17 is formed at the bottom of the contact hole 14 as shown in FIG. 1D. Thus, the native oxide film 17 at the bottom of the contact hole is removed by soft-etching the native oxide film by a chemical dry process using a gas including, for example, either $HF_3$ or HF. It is desirable that the gas should be a combination of, for example, $NF_3$ and $NH_3$, of $NF_3$, $N_2$, and $H_2$, or of HF and $NH_3$. In addition, it is desirable that the temperature of the substrate 11 in the chemical dry process should be in the range from, for example, −20° C. or higher to +30° C. or lower. If the processing temperature is lower than −20° C. or higher than +30° C., it is difficult to etch the native oxide film. To obtain much better results, it is desirable that the processing temperature should be in the range from −20° C. or higher to +25° C. or lower.

Thereafter, a small amount of thermally decomposable reaction product, such as $(NH_4)_2SiF_6$, (not shown) produced in etching to remove the native oxide film is removed by heat treatment. It is desirable that the temperature of the substrate 11 in the heat treatment should be in the range of, for example, 100° C. or higher to 400° C. or lower. If the temperature is lower than 100° C., it is difficult to remove the product sufficiently. If the temperature is higher than 400° C., the performance of the transistor can deteriorate. To obtain much better results, it is desirable that the temperature of substrate 11 should be in the range from 150° C. or higher to 400° C. or lower. However, the upper limit temperature can be raised in the range allowed by the performance of the transistor. Furthermore, it is desirable that the chemical dry process and heat treatment should be carried out without the rupture of vacuum to prevent the re-formation of a native oxide film. That is, it is desirable that these processes should be carried out consecutively in a vacuum.

The native oxide film 17 at the bottom of the contact hole can be removed by the chemical dry process and heat treatment, which enables the surface of the NiSi layer 12 to be exposed as shown in FIG. 1E. As described above, after the contact hole 14 is made, the ashing process, wet process, chemical dry process, and heat treatment are carried out sequentially, thereby removing the etching damage layer 15, Ni—O (F) layer 16, and native oxide film 17 from the surface of the NiSi layer 12, which causes the clean NiSi layer 12 to be exposed as shown by (4) of FIG. 6, in (5) of FIG. 2, and in (5) of FIG. 3.

Thereafter, inside the contact hole 14, a single-layer or multilayer barrier metal 18 is made of metal material by, for example, sputtering or CVD techniques. Then, the contact hole 14 is filled with metal material (not shown), thereby forming a contact plug. As the metal material, for example, Ti, TiN, Ta, TaN, W, WN, Cu, Al, or the like is used.

Figure 7:
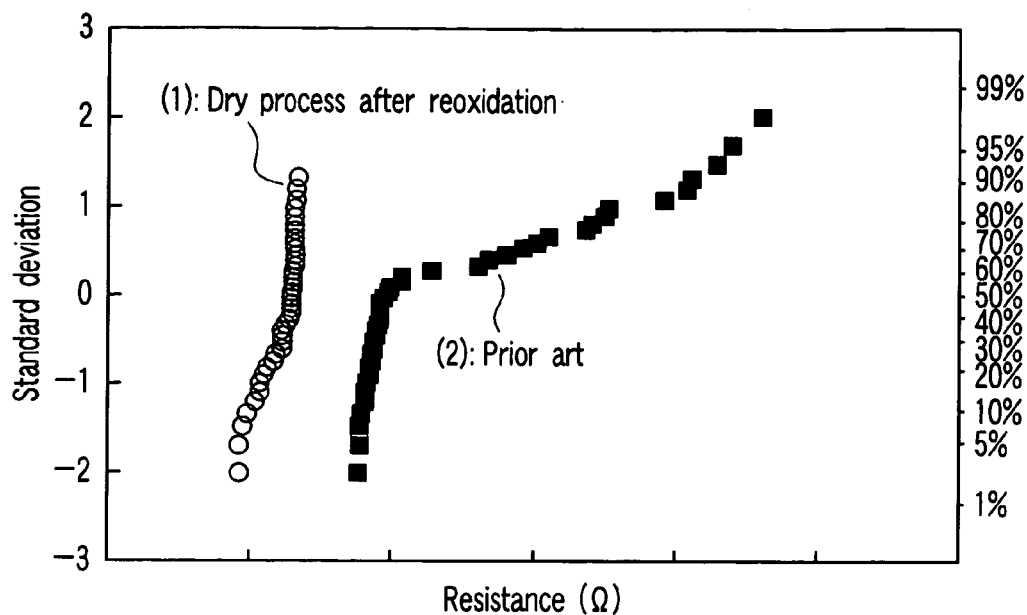
FIG. 7 shows variations in the contact resistance of the first embodiment and in a conventional contact resistance.

As described above, a film of a barrier metal 18 is formed at the surface of the clean NiSi layer 12, thereby realizing a stabler, lower contact resistance as shown by (1) of FIG. 7 than that of a conventional equivalent shown by (2) of FIG. 7.

It is desirable that the barrier metal should be formed in consecutive processes without the exposure of the NiSi layer 12 at the bottom of the contact hole to the air. Therefore, a barrier metal is formed, for example, in another chamber connected and clustered with the chamber used to make the contact hole.

In the first embodiment, the contact hole 14 is made in the silicon oxide film 13 on the NiSi layer 12. After the resist is removed, the ashing process as dry cleaning, wet process, chemical dry process, and heat treatment are carried out in sequence, thereby removing the etching damage layer 15, Ni—O (F) layer 16, and native oxide film 17 from the surface of the NiSi layer 12. Therefore, the clean NiSi layer 12 can be exposed at the bottom of the contact hole 14, which enables a stable, low contact resistance to be realized.

Second Embodiment

In the first embodiment, the damage layer, etching product, and native oxide film in a contact hole have been removed. The processes in the first embodiment can be applied to alleviate the steps in a contact hole made in a plurality of insulating films differing in, for example, the etching selection ratio.

Specifically, to reduce the heat history in the post-process of the NiSi or shallow diffused layer, a silicon nitride film and a silicon oxide film formed by, for example, CVD techniques are applied to the contact process. The etching speeds of these silicon nitride film and silicon oxide film in dry etching and wet etching are faster than that of an oxide film formed at 800° C. or higher in the prior art. The difference in etching speed is particularly large in wet etching. Specifically, the etching speed of a silicon nitride film with a fluoric acid (HF) solution is, for example, 10 or more times as fast as that of an oxide film formed at 800° C. or higher. Moreover, the etching speed of a silicon oxide film with a fluoric acid solution is, for example, two or more times as fast as that of an oxide film formed at 800° C. or higher. Therefore, when a contact hole is made in a stacked layer of a silicon nitride film and a silicon oxide film by RIE techniques, or when a wet process is carried out in a pretreatment in forming a barrier metal in a contact hole, steps develop at the sidewall of the contact hole. In this state, when a barrier metal is formed in the contact hole, the coverage of the contact hole with the barrier metal deteriorates. Consequently, there is possibility that an increase in the contact resistance and a leak may occur.

To overcome this problem, a second embodiment of the present invention alleviates the steps in the contact hole by applying the processes of the first embodiment.

Hereinafter, a semiconductor device manufacturing method according to the second embodiment will be explained.

Figures 8A, 8B:
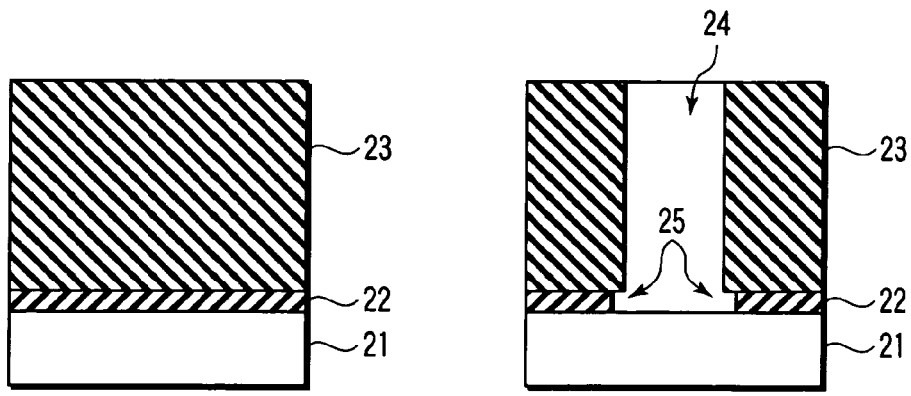
FIGS. 8A, 8B, and 8C are sectional views to help explain a semiconductor device manufacturing method according to a second embodiment of the present invention.
Figure 8C:
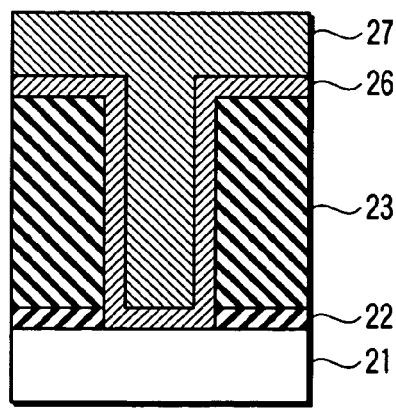

FIGS. 8A, 8B, and 8C show a semiconductor device manufacturing method according to the second embodiment.

As shown in FIG. 8A, a silicon nitride film 22 is formed at the surface of, for example, a conducting layer 21 by, for example, a CVD method. On the silicon nitride film 22, a silicon oxide film 23 is formed by, for example, a CVD method. The conducting layer 21 is, for example, silicon, polysilicon, amorphous silicon, $CoSi_2$, NiSi, TiN, W, or WN and is not limited to these.

Next, as shown in FIG. 8B, with a resist pattern (not shown) as a mask, the silicon oxide film 23 and silicon nitride film 22 are etched by RIE techniques, thereby making a contact hole 24 in the silicon oxide film 23 and silicon nitride film 22. As the etching gas, for example, a gas obtained by adding $H_2$ to $CF_4$ or a gas of the $NF_3$ family is used. As a result of the etching, steps or damage layers are produced in the contact hole 24.

Thereafter, as in the first embodiment, the damage layer (not shown) is removed by dry cleaning, such as an ashing process. Then, the resulting layer is subjected to a wet process with, for example, sulfuric acid-hydrogen peroxide mixture, hydrogen peroxide solution, and choline solution in sequence. By the wet process, the product produced in the ashing process is removed. In the wet process, steps 25 are formed due to the difference in etching speed between the silicon nitride film 22 and the silicon oxide film 23 as shown in FIG. 8B. The steps 25 are, for example, about 1 nm in height.

Thereafter, a chemical dry process is carried out using a gas including either $NF_3$ or HF. By this dry etching, the inner wall of the silicon oxide film 23 in the contact hole 24 is etched, thereby alleviating the steps 25 formed at the sidewall of the contact hole 24 as shown in FIG. 8C.

Then, as in the first embodiment, the thermally decomposable reaction product produced in the chemical dry process is removed by heat treatment.

Thereafter, a barrier metal 26 composed of a single layer or a plurality of layers is formed by, for example, sputtering or CVD techniques. Then, for example, a metal layer 27 is formed in the contact hole 24.

In the second embodiment, after the contact hole 24 is formed, an ashing process as dry cleaning, a wet process, a chemical dry process with a gas including either $NF_3$ or HF, and heat treatment are carried out. As a result, the steps 25 formed in the contact hole 24 are alleviated. Accordingly, when barrier metal is formed in the contact hole 24, the coverage inside the contact hole is good, which prevents the contact resistance from increasing and a leak from occurring.

In the second embodiment, to remove the steps in the contact hole, all of the ashing process, wet process, chemical dry process with a gas including either $NF_3$ or HF, and heat treatment need not be carried out. At least a chemical dry process with a gas including either $NF_3$ or HF and heat treatment has only to be carried out.

Furthermore, in each of the first and second embodiments, the case where a contact hole is made has been explained. This invention is not limited to this. For instance, the first and second embodiments may be applied to the formation of a via hole connecting a lower-layer wiring line to an upper-layer wiring line.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device manufacturing method comprising:
   dry-etching an insulating film formed on a metal silicide layer so as to make a connection hole in the insulating film to expose the metal silicide layer;
   supplying plasma excited from an oxidized gas onto the exposed metal silicide layer to dry-clean a damage layer produced in the connection hole;
   removing a product produced on the metal silicide layer in the connection hole as a result of the dry cleaning by a wet process;
   etching an oxide film formed in the connection hole as a result of the wet process by a chemical dry process using a gas including either $NF_3$ or HF; and
   removing a thermally decomposable reaction product produced as a result of the etching by heat treatment.

2. The semiconductor device manufacturing method according to claim 1, wherein the metal silicide layer is one of $CoSi_x$, $NiSi_x$, $ErSi_x$, $PtSi_x$, and $Pd_2Si_x$.

3. The semiconductor device manufacturing method according to claim 1, wherein the wet process uses a solution including hydrogen peroxide.

4. The semiconductor device manufacturing method according to claim 1, wherein the oxidized gas includes one of oxygen gas and ozone.

5. The semiconductor device manufacturing method according to claim 1, wherein the dry cleaning is performed at a temperature in the range from 150° C. or higher to 400° C. or lower.

6. The semiconductor device manufacturing method according to claim 1, wherein the chemical dry process and heat treatment are executed consecutively in a vacuum.

7. The semiconductor device manufacturing method according to claim 6, wherein the chemical dry process is carried out at a temperature in the range from −20° C. or higher to +30° C. or lower.

8. The semiconductor device manufacturing method according to claim 6, wherein the heat treatment is carried out at a temperature in the range from 100° C. or higher to 400° C. or lower.

9. The semiconductor device manufacturing method according to claim 1, further comprising:
   forming a conducting barrier layer at the inner surface of the connection hole after the heat treatment; and
   forming a contact plug inside the connection hole.

10. The semiconductor device manufacturing method according to claim 9, wherein the heat treatment and the formation of the barrier layer are performed consecutively without being exposed to the air.

* * * * *